(12) United States Patent
Tasic et al.

(10) Patent No.: US 10,033,343 B2
(45) Date of Patent: Jul. 24, 2018

(54) SPECTRUM SENSING RADIO RECEIVER

(71) Applicant: QUALCOMM Incorporated, San Diego, CA (US)

(72) Inventors: Aleksandar Miodrag Tasic, San Diego, CA (US); Chiewcharn Narathong, Laguna Niguel, CA (US); Gurkanwal Singh Sahota, San Diego, CA (US); Shrenik Patel, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/231,103

(22) Filed: Mar. 31, 2014

(65) Prior Publication Data
US 2015/0280673 A1 Oct. 1, 2015

(51) Int. Cl.
*H03G 3/30* (2006.01)
*H04B 1/00* (2006.01)
*H04B 1/10* (2006.01)

(52) U.S. Cl.
CPC ......... *H03G 3/3036* (2013.01); *H04B 1/0003* (2013.01); *H04B 1/005* (2013.01); *H04B 1/1027* (2013.01)

(58) Field of Classification Search
CPC ...... H03G 3/3052; H03G 3/20; H03G 3/3068; H03G 3/3036; H04B 17/02; H04B 1/06; H04B 1/0003; H04B 1/005; H04B 1/1027
See application file for complete search history.

(56) References Cited

U.S. PATENT DOCUMENTS

| | | | | |
|---|---|---|---|---|
| 6,107,878 A | * | 8/2000 | Black | 330/129 |
| 6,208,849 B1 | | 3/2001 | Cho et al. | |
| 6,498,926 B1 | * | 12/2002 | Ciccarelli et al. | 455/240.1 |
| 7,653,368 B2 | * | 1/2010 | Ashkenazi | 455/234.1 |
| 7,711,334 B2 | * | 5/2010 | Sivasubramaniam | 455/130 |
| 8,009,776 B2 | * | 8/2011 | Gao et al. | 375/345 |
| 8,223,889 B2 | | 7/2012 | Cabric | |
| 8,483,644 B2 | * | 7/2013 | Busson et al. | 455/306 |
| 8,594,121 B2 | | 11/2013 | Thakur et al. | |
| 8,624,654 B2 | * | 1/2014 | Sasho et al. | 327/308 |
| 8,724,751 B2 | * | 5/2014 | Lindoff | H04B 1/0003 375/346 |
| 2006/0217094 A1 | * | 9/2006 | Ikeda et al. | 455/136 |
| 2006/0291428 A1 | | 12/2006 | Filipovic | |
| 2007/0153878 A1 | | 7/2007 | Filipovic | |
| 2009/0253376 A1 | | 10/2009 | Parssinen et al. | |

(Continued)

FOREIGN PATENT DOCUMENTS

| | | |
|---|---|---|
| CN | 101427466 A | 5/2009 |
| CN | 202309692 U | 7/2012 |

(Continued)

OTHER PUBLICATIONS

International Search Report and Written Opinion—PCT/US2015/022884—ISA/EPO—Jul. 2, 2015.

*Primary Examiner* — Pablo Tran
(74) *Attorney, Agent, or Firm* — Smith Tempel Blaha LLC/Qualcomm

(57) ABSTRACT

A device includes a reconfigurable receiver front end having variable gain and variable bandwidth configured to tune to a plurality of communication channels in a communication band, the reconfigurable receiver front end responsive to a signal power level.

13 Claims, 11 Drawing Sheets

(56) References Cited

U.S. PATENT DOCUMENTS

| | | |
|---|---|---|
| 2009/0280766 A1 | 11/2009 | Rofougaran et al. |
| 2010/0009646 A1* | 1/2010 | Mevel et al. .............. 455/234.1 |
| 2010/0136939 A1* | 6/2010 | Kim et al. ................. 455/247.1 |
| 2010/0197257 A1* | 8/2010 | Rajkotia ............. H04B 1/1036 455/188.1 |
| 2011/0244820 A1 | 10/2011 | Khoini-Poorfard et al. |
| 2012/0039183 A1 | 2/2012 | Barbieri et al. |
| 2012/0302188 A1 | 11/2012 | Sahota et al. |
| 2013/0051500 A1 | 2/2013 | Mo et al. |
| 2013/0195215 A1* | 8/2013 | Manglani et al. ............ 375/295 |
| 2013/0203368 A1* | 8/2013 | Pullela et al. ................ 455/131 |
| 2013/0265892 A1 | 10/2013 | Fernando |

FOREIGN PATENT DOCUMENTS

| | | |
|---|---|---|
| EP | 2120349 A1 | 11/2009 |
| EP | 2393208 A2 | 12/2011 |
| WO | 2010129584 A1 | 11/2010 |
| WO | 2013057358 A1 | 4/2013 |
| WO | 2015069570 | 5/2015 |

\* cited by examiner

SPECTRUM SENSING RADIO RECEIVER

BACKGROUND

Field

The present disclosure relates generally to electronics, and more specifically to transmitters and receivers.

Background

In a radio frequency (RF) transceiver, a communication signal is typically received and downconverted by receive circuitry, sometimes referred to as a receive chain. A receive chain typically includes a receive filter, a low noise amplifier (LNA), a mixer, a local oscillator (LO), a voltage controlled oscillator (VCO), a baseband filter, and other components, to recover the information contained in the communication signal. The transceiver also includes circuitry that enables the transmission of a communication signal to a receiver in another transceiver. The transceiver may be able to operate over multiple frequency ranges, typically referred to a frequency bands. Moreover, a single transceiver may be configured to operate using multiple carrier signals that may occur in the same frequency band, but that may not overlap in actual frequency, an arrangement referred to as non-contiguous carriers.

In a cellular communication environment, the number of radio frequency (RF) carriers allocated to the end-user is limited because it is difficult to determine the available spectrum and sufficient spectrum must remain available to meet various quality of service (QOS) commitments. As a result, often there is unused spectrum. Wireless service providers have only a limited knowledge of the available spectrum around each user and around each user equipment (UE). A receiver in a UE, such as a mobile telephone, generally does not allow for a periodic analysis of the radio spectrum available to the UE.

Therefore, it would be desirable to have a way for a UE to obtain a periodic analysis of the spectrum available at a given time.

BRIEF DESCRIPTION OF THE DRAWINGS

In the figures, like reference numerals refer to like parts throughout the various views unless otherwise indicated. For reference numerals with letter character designations such as "102a" or "102b", the letter character designations may differentiate two like parts or elements present in the same figure. Letter character designations for reference numerals may be omitted when it is intended that a reference numeral encompass all parts having the same reference numeral in all figures.

DETAILED DESCRIPTION

The word "exemplary" is used herein to mean "serving as an example, instance, or illustration." Any aspect described herein as "exemplary" is not necessarily to be construed as preferred or advantageous over other aspects.

In this description, the term "application" may also include files having executable content, such as: object code, scripts, byte code, markup language files, and patches. In addition, an "application" referred to herein, may also include files that are not executable in nature, such as documents that may need to be opened or other data files that need to be accessed.

The term "content" may also include files having executable content, such as: object code, scripts, byte code, markup language files, and patches. In addition, "content" referred to herein, may also include files that are not executable in nature, such as documents that may need to be opened or other data files that need to be accessed.

As used herein, the terms "interfering signal," "jammer," "jammer signal," and "TX jammer" are used to describe a signal present at a receiver that can degrade the receiver's performance in detecting and downconverting a desired receive signal.

Exemplary embodiments of the disclosure are directed toward a spectrum sensing radio that allows downconverting one or more communication channels up to and including an entire receive band with a reconfigurable receiver using a single local oscillator (LO) path, single voltage controlled oscillator (VCO), and singe phase locked loop (PLL). When the LO frequency is located substantially halfway between the two non-contiguous carriers, a single LO/VCO/PLL path can be used to downconvert two non-contiguous carriers.

Figure 1:
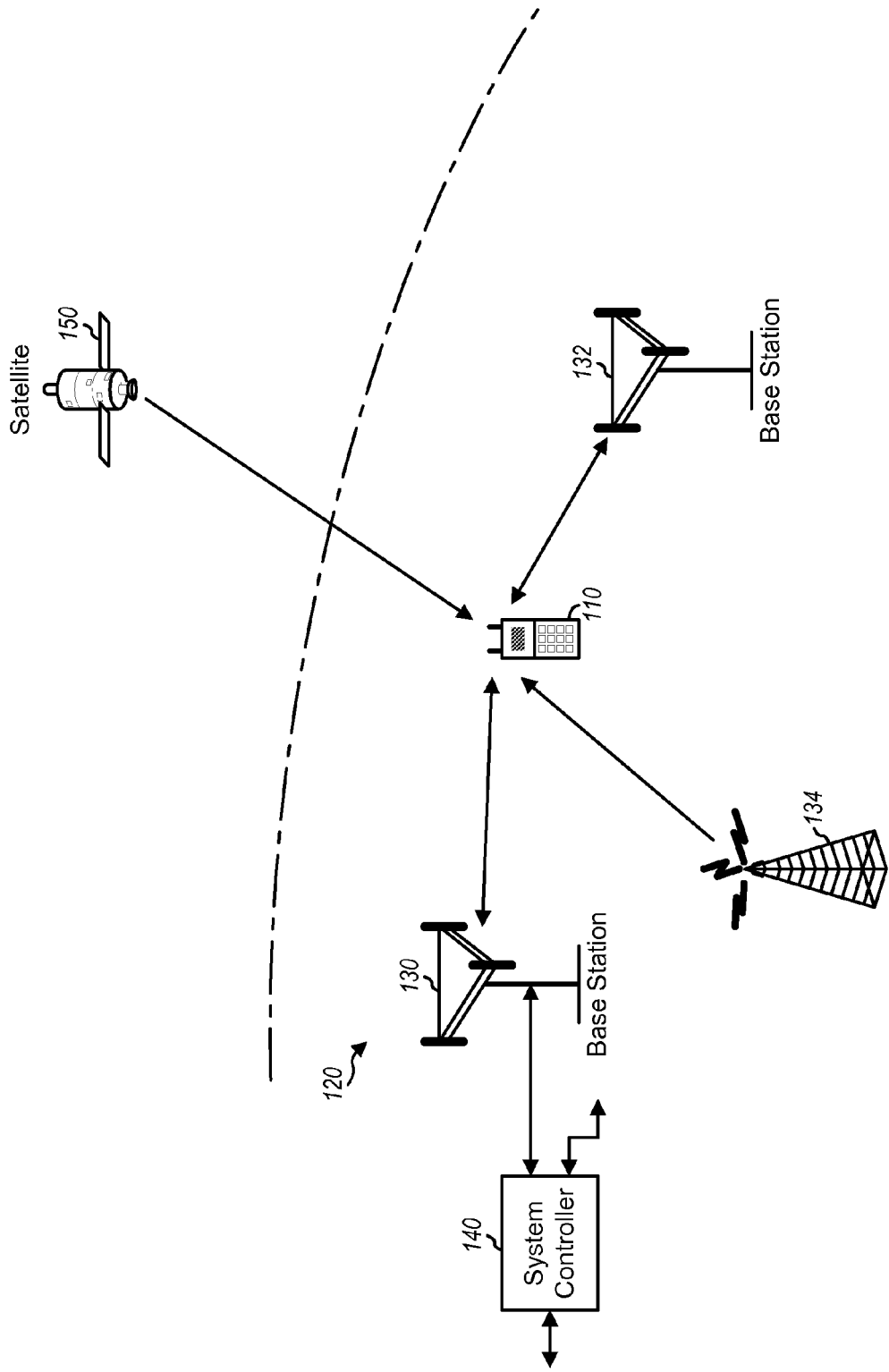
FIG. 1 is a diagram showing a wireless device communicating with a wireless communication system.

FIG. 1 is a diagram showing a wireless device 110 communicating with a wireless communication system 120. The wireless communication system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1x, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless communication system may include any number of base stations and any set of network entities.

The wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a tablet, a cordless phone, a wireless local loop (WLL) station, a Bluetooth device, etc. Wireless device 110 may communicate with wireless communication system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1x, EVDO, TD-SCDMA, GSM, 802.11, etc.

Wireless device 110 may support carrier aggregation, which is operation on multiple carriers. Carrier aggregation may also be referred to as multi-carrier operation. Wireless device 110 may be able to operate in low-band (LB) covering frequencies lower than 1000 megahertz (MHz), mid-band (MB) covering frequencies from 1000 MHz to 2300 MHz, and/or high-band (HB) covering frequencies higher than 2300 MHz. For example, low-band may cover 698 to 960 MHz, mid-band may cover 1475 to 2170 MHz, and high-band may cover 2300 to 2690 MHz and 3400 to 3800 MHz. Low-band, mid-band, and high-band refer to three groups of bands (or band groups), with each band group including a number of frequency bands (or simply, "bands"). Each band may cover up to 200 MHz and may include one or more carriers. Each carrier may cover up to 20 MHz in LTE. LTE Release 11 supports 35 bands, which are referred to as LTE/UMTS bands and are listed in 3GPP TS 36.101. Wireless device 110 may be configured with up to five carriers in one or two bands in LTE Release 11.

In general, carrier aggregation (CA) may be categorized into two types—intra-band CA and inter-band CA. Intra-band CA refers to operation on multiple carriers within the same band. Inter-band CA refers to operation on multiple carriers in different bands.

Figure 2:
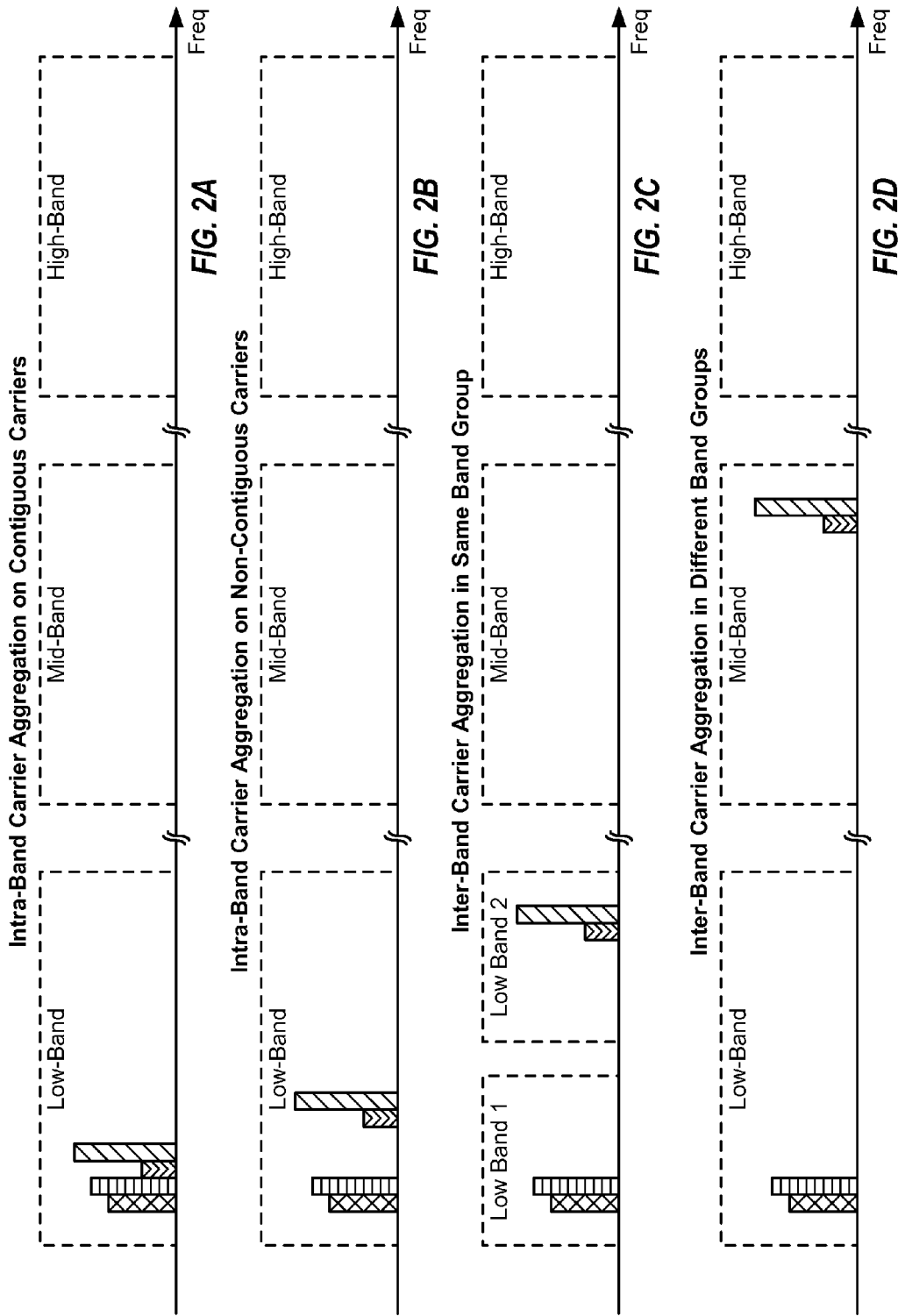
FIG. 2A is a graphical diagram showing an example of contiguous intra-band carrier-aggregation (CA).
FIG. 2B is a graphical diagram showing an example of non-contiguous intra-band CA.
FIG. 2C is a graphical diagram showing an example of inter-band CA in the same band group.
FIG. 2D is a graphical diagram showing an example of inter-band CA in different band groups.

FIG. 2A is a graphical diagram showing an example of contiguous intra-band carrier-aggregation (CA). In the example shown in FIG. 2A, wireless device 110 is configured with four contiguous carriers in one band in low-band. Wireless device 110 may send and/or receive transmissions on the four contiguous carriers within the same band.

FIG. 2B is a graphical diagram showing an example of non-contiguous intra-band CA. In the example shown in FIG. 2B, wireless device 110 is configured with four non-contiguous carriers in one band in low-band. The carriers may be separated by 5 MHz, 10 MHz, or some other amount. Wireless device 110 may send and/or receive transmissions on the four non-contiguous carriers within the same band.

FIG. 2C is a graphical diagram showing an example of inter-band CA in the same band group. In the example shown in FIG. 2C, wireless device 110 is configured with four carriers in two bands in low-band. Wireless device 110 may send and/or receive transmissions on the four carriers in different bands in the same band group.

FIG. 2D is a graphical diagram showing an example of inter-band CA in different band groups. In the example shown in FIG. 2D, wireless device 110 is configured with four carriers in two bands in different band groups, which include two carriers in one band in low-band and two carriers in another band in mid-band. Wireless device 110 may send and/or receive transmissions on the four carriers in different bands in different band groups.

FIGS. 2A to 2D show four examples of carrier aggregation. Carrier aggregation may also be supported for other combinations of bands and band groups.

Figure 3:
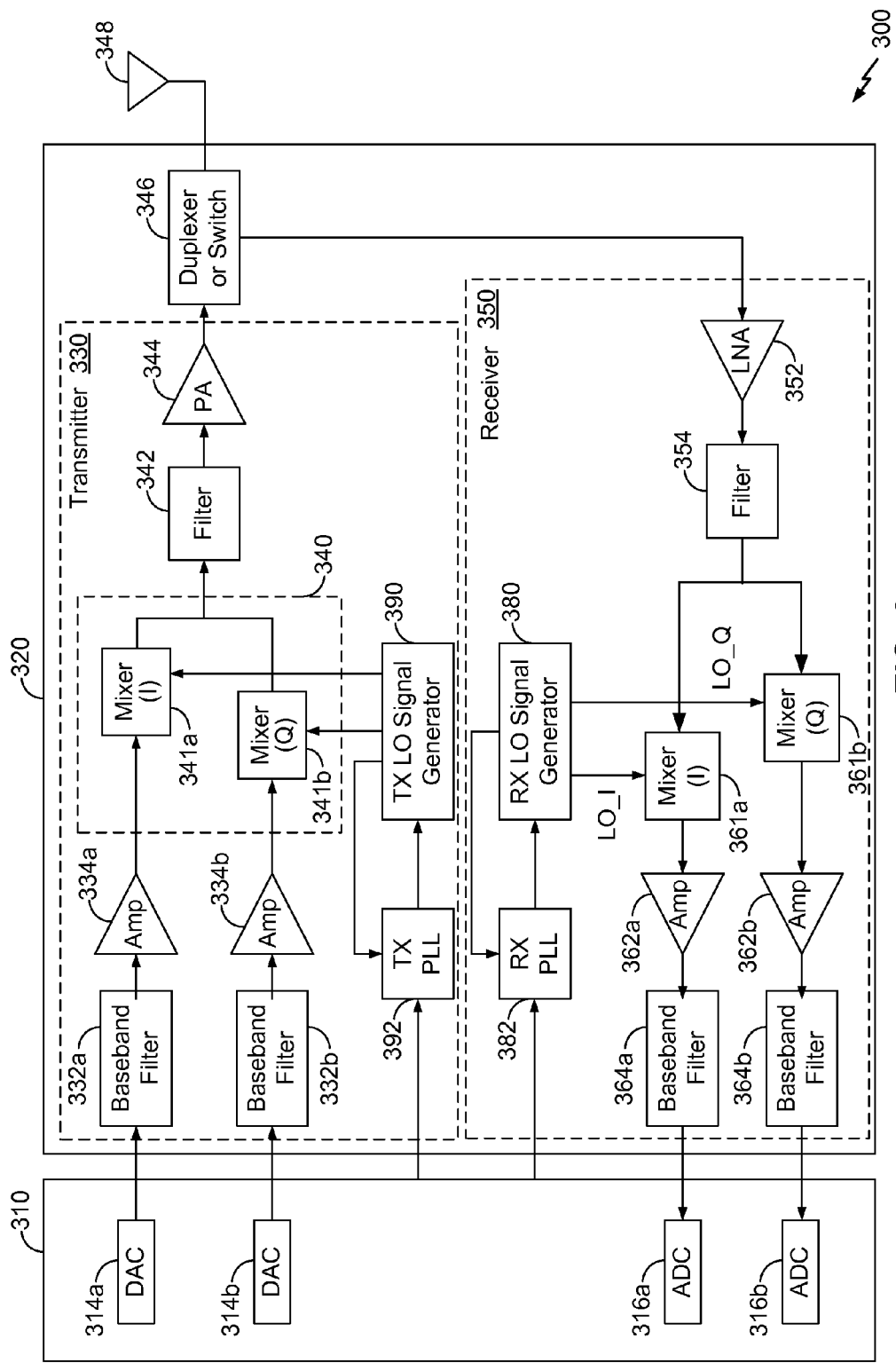
FIG. 3 is a block diagram of an exemplary design of wireless device in FIG. 1.

FIG. 3 is a block diagram showing a wireless communication device 300 in which the exemplary techniques of the present disclosure may be implemented. FIG. 3 shows an example of a transceiver 300. In general, the conditioning of the signals in a transmitter 330 and a receiver 350 may be performed by one or more stages of amplifier, filter, upconverter, downconverter, etc. These circuit blocks may be arranged differently from the configuration shown in FIG. 3. Furthermore, other circuit blocks not shown in FIG. 3 may also be used to condition the signals in the transmitter and receiver. Unless otherwise noted, any signal in FIG. 3, or any other figure in the drawings, may be either single-ended or differential. Some circuit blocks in FIG. 3 may also be omitted.

In the example shown in FIG. 3, wireless device 300 generally comprises a transceiver 320 and a data processor 310. The data processor 310 may include a memory (not shown) to store data and program codes, and may generally comprise analog and digital processing elements. The transceiver 320 includes a transmitter 330 and a receiver 350 that support bi-directional communication. In general, wireless device 300 may include any number of transmitters and/or receivers for any number of communication systems and frequency bands. All or a portion of the transceiver 320 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the example shown in FIG. 3, transmitter 330 and receiver 350 are implemented with the direct-conversion architecture.

In the transmit path, the data processor 310 processes data to be transmitted and provides in-phase (I) and quadrature (Q) analog output signals to the transmitter 330. In an exemplary embodiment, the data processor 310 includes digital-to-analog-converters (DAC's) 314a and 314b for converting digital signals generated by the data processor 310 into the I and Q analog output signals, e.g., I and Q output currents, for further processing.

Within the transmitter 330, baseband filters 332a and 332b filter the I and Q analog transmit signals, respectively, to remove undesired images caused by the prior digital-to-analog conversion. The baseband filters 332a and 332b can be lowpass filters or bandpass filters, depending on the implementation. Amplifiers (Amp) 334a and 334b amplify the signals from baseband filters 332a and 332b, respectively, and provide I and Q baseband signals. An upconverter 340 upconverts the I and Q baseband signals with I and Q transmit (TX) local oscillator (LO) signals from a TX LO signal generator 390 and provides an upconverted signal. A filter 342 filters the upconverted signal to remove undesired images caused by the frequency upconversion as well as noise in a receive frequency band. A power amplifier (PA)

344 amplifies the signal from filter 342 to obtain the desired output power level and provides a transmit RF signal. The transmit RF signal is routed through a duplexer or switch 346 and transmitted via an antenna 348.

In the receive path, antenna 348 receives communication signals and provides a received RF signal, which is routed through duplexer or switch 346 and provided to a low noise amplifier (LNA) 352. The duplexer 346 is designed to operate with a specific RX-to-TX duplexer frequency separation, such that RX signals are isolated from TX signals. The received RF signal is amplified by LNA 352 and filtered by a filter 354 to obtain a desired RF input signal. Downconversion mixers 361a and 361b mix the output of filter 354 with I and Q receive (RX) LO signals (i.e., LO_I and LO_Q) from an RX LO signal generator 380 to generate I and Q baseband signals. The I and Q baseband signals are amplified by amplifiers 362a and 362b and further filtered by baseband filters 364a and 364b to obtain I and Q analog input signals, which are provided to data processor 310. The baseband filters 364a and 364b can be lowpass filters or bandpass filters, depending on the implementation. In the exemplary embodiment shown, the data processor 310 includes analog-to-digital-converters (ADC's) 316a and 316b for converting the analog input signals into digital signals to be further processed by the data processor 310.

In FIG. 3, TX LO signal generator 390 generates the I and Q TX LO signals used for frequency upconversion, while RX LO signal generator 380 generates the I and Q RX LO signals used for frequency downconversion. Each LO signal is a periodic signal with a particular fundamental frequency. A phase locked loop (PLL) 392 receives timing information from data processor 310 and generates a control signal used to adjust the frequency and/or phase of the TX LO signals from LO signal generator 390. Similarly, a PLL 382 receives timing information from data processor 310 and generates a control signal used to adjust the frequency and/or phase of the RX LO signals from LO signal generator 380.

Wireless device 300 may support CA and may (i) receive multiple downlink signals transmitted by one or more cells on multiple downlink carriers at different frequencies and/or (ii) transmit multiple uplink signals to one or more cells on multiple uplink carriers. In an exemplary embodiment, the wireless device 300 supports intra-carrier aggregation and can use a single LO signal to downconvert multiple intra-CA receive signals.

Figure 4:
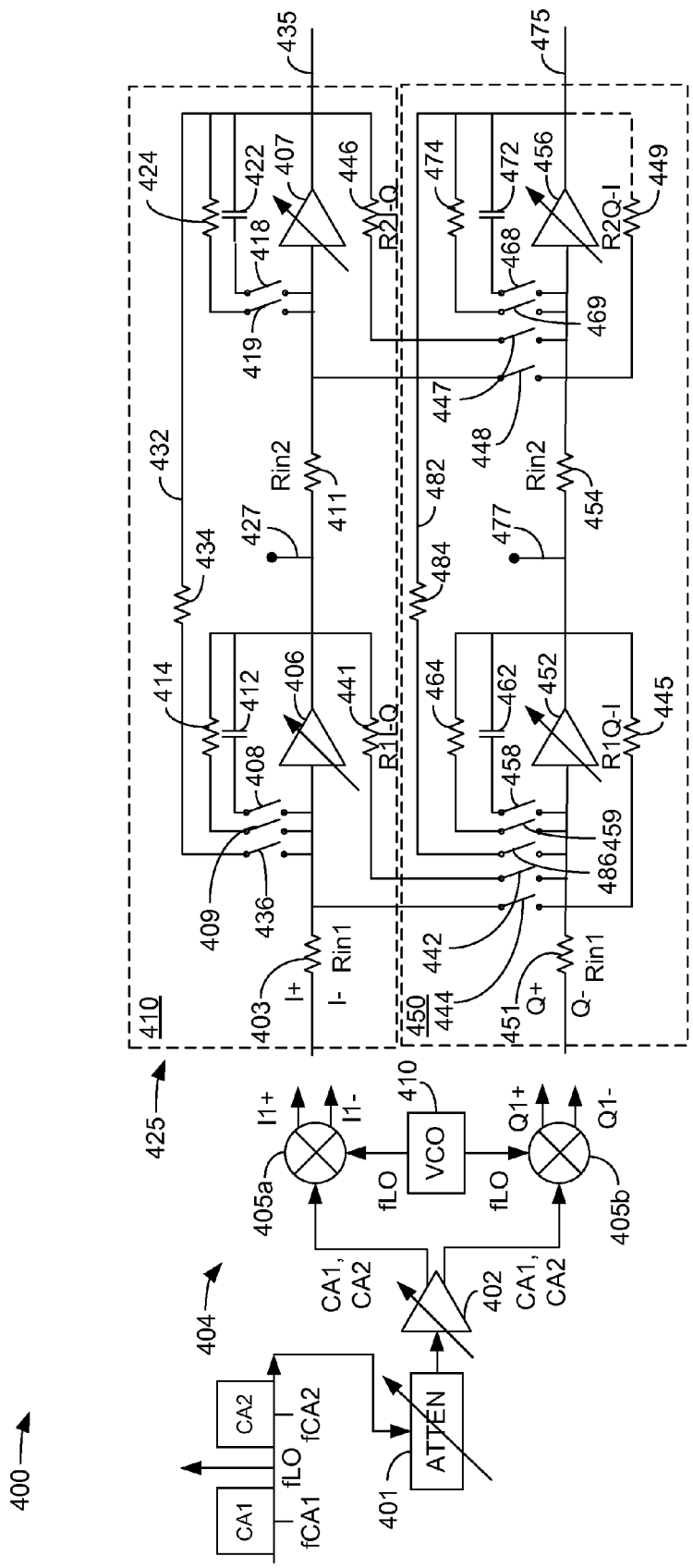
FIG. 4 is a schematic diagram illustrating an exemplary embodiment of a receiver front-end of a spectrum sensing radio.

FIG. 4 is a schematic diagram illustrating an exemplary embodiment of a receiver front-end of a spectrum sensing radio. The receiver front-end 400 comprises an adjustable attenuator 401, and an adjustable low noise amplifier (LNA) 402 configured to receive two non-contiguous carriers CA1 and CA2, and provide the carriers CA1 and CA2 to a mixer 404. Although two non-contiguous carriers are illustrated, the spectrum sensing radio receiver is applicable to single carrier and multi-carrier operation. The mixer 404 comprises an in-phase (I) mixer 405a and a quadrature (Q) mixer 405b. The mixer 404 receives a single local oscillator (LO) signal generated by a receive LO signal generator (referred to as a voltage controlled oscillator (VCO) 410. The VCO 410 includes a phase locked loop (PLL) (not shown for simplicity). The receiver front-end 400 also comprises a reconfigurable baseband filter 425.

The baseband filter 425 is one exemplary embodiment of the baseband filter 364a and the baseband filter 364b shown in FIG. 3. In an exemplary embodiment the filter 425 is shown in a single-ended embodiment, but is configured to receive differential in-phase (I+, I−) and differential quadrature (Q+, Q−) components of a received signal provided by the low noise amplifier (LNA, FIG. 3), mixer 361a and 361b (FIG. 3) and the amplifiers 362a and 362b (FIG. 3). In an exemplary embodiment, the differential in-phase (I+, I−) components are processed by a first filter portion 410 and the differential quadrature (Q+, Q−) components are processed by a second filter portion 450. In an exemplary embodiment, one or more components of the baseband filter 425 can be adjustable based on one or more control signals so as to adjust the response of the filter 425.

The filter 425 can be configured to operate in multiple modes that can form multiple sub-filters. The multiple modes make use of different components in the filter 425. For example, with reference to the first filter portion 410, a first mode comprises using a first input resistance 403, a first in-phase (I) amplifier stage 406, a second input resistance 411 and a second I amplifier stage 407. In an exemplary embodiment, the first I amplifier stage 406 may comprise a transimpedance amplifier (TIA) stage and the second I amplifier stage 407 may comprise a pseudo-balanced amplifier (PBA) stage. However, other amplification technologies and architectures are possible. The first I amplifier stage 406 comprises a resistive/capacitive (RC) feedback network comprising a capacitance 412 connected between the input and the output of the first I amplifier stage 406 through a switch 408; and a resistance 414 connected between the input and the output of the first I amplifier stage 406 through a switch 409. The second I amplifier stage 407 comprises a resistive/capacitive (RC) feedback network comprising a capacitance 422 connected between the input and the output of the second I amplifier stage 407 through a switch 418; and a resistance 424 connected between the input and the output of the second I amplifier stage 407 through a switch 419. The switches 408, 409, 418 and 419 can be fabricated using any of a variety of transistor devices and technologies and can be controlled to be conductive or non-conductive using control logic (not shown). In an exemplary embodiment, the first I amplifier stage 406 and the second I amplifier stage 407 are illustrated as being adjustable to denote that the response of the first filter portion 410 can be adjustable based on one or more control signals (not shown) that can be developed based on a detected jammer signal. However, in addition to the first I amplifier stage 406 and the second I amplifier stage 407, some or all of the capacitances 412 and 422, and some or all of the resistances 414 and 424 may also be adjustable.

With reference to the second filter portion 450, the first mode comprises using a first input resistance 451, a first quadrature (Q) amplifier stage 452, a second input resistance 454 and a second Q amplifier stage 456. In an exemplary embodiment, the first Q amplifier stage 452 may comprise a transimpedance amplifier (TIA) stage and the second amplifier stage 456 may comprise a pseudo-balanced amplifier (PBA) stage. However, other amplification technologies and architectures are possible. The first Q amplifier stage 452 comprises a resistive/capacitive (RC) feedback network comprising a capacitance 462 connected between the input and the output of the first Q amplifier stage 452 through a switch 458; and a resistance 464 connected between the input and the output of the first Q amplifier stage 452 through a switch 459.

The second Q amplifier stage 456 comprises a resistive/capacitive (RC) feedback network comprising a capacitance 472 connected between the input and the output of the second Q amplifier stage 456 through a switch 468; and a resistance 474 connected between the input and the output of the second Q amplifier stage 456 through a switch 469. The switches 458, 459, 468 and 469 can be fabricated using any of a variety of transistor devices and can be controlled to be conductive or non-conductive using control logic (not shown).

When the switches 408, 409, 458 and 459 are conductive, a one-stage filter with real poles can be constructed (with RC feedback around the first I amplifier stage 406 and the first Q amplifier stage 452. When the switches 408, 409, 418, 419, 458, 459, 468 and 469 are conductive, a two-stage filter with real poles can be constructed (with RC-feedback around the first I amplifier stage 406, first Q amplifier stage 452 and around the second I amplifier stage 407, and the second Q amplifier stage 456. A real filter having real poles provides modest filtering with reduced complexity. In an exemplary embodiment, the first Q amplifier stage 452 and the second Q amplifier stage 456 are illustrated as being adjustable to denote that the response of the second filter portion 450 can be adjustable based on one or more control signals (not shown) that can be developed based on a detected jammer signal. However, in addition to the first Q amplifier stage 452 and the second Q amplifier stage 456, some or all of the capacitances 462 and 472, and some or all of the resistances 464 and 474 may also be adjustable.

As mentioned above, in addition to being adjustable for response, the filter 425 can be configured to operate in multiple modes. The multiple modes make use of different components in the filter 425. With continued reference to the first filter portion 410, a second mode adds a first negative feedback path 432 from the output of the second I amplifier 407, through a resistance 434 and through a switch 436 coupled between the resistance 434 and the input to the first I amplifier stage 406. In a differential application, the feedback path 432 provides negative feedback from the positive output of the second I amplifier stage 407 to the negative input of the first I amplifier stage 406 and from the negative output of the second I amplifier stage 407 to the positive input of the first I amplifier stage 406.

Similarly, with continued reference to the second filter portion 450, a second mode adds a second negative feedback path 482 from the output of the second Q amplifier stage 456, through a resistance 484 and through a switch 486 coupled between the resistance 484 and the input to the first Q amplifier stage 452. In a differential application, the feedback path 482 provides negative feedback from the positive output of the second Q amplifier stage 456 to the negative input of the first Q amplifier stage 452 and from the negative output of the second Q amplifier stage 456 to the positive input of the first Q amplifier stage 452. The switches 436 and 486 can be fabricated using any of a variety of transistor devices and can be controlled to be conductive or non-conductive using control logic (not shown).

When the switches 436 and 486 are conductive, along with the switches 408, 409, 418, 419, 458, 459, 468 and 469 being conductive, a real filter with complex poles can be constructed (including RC feedback around first I amplifier stage 402 and first Q amplifier stage 452; and second I amplifier stage 406 and second Q amplifier stage 456, with overall negative feedback through the first negative feedback path 432 and the second negative feedback path 482. In this exemplary embodiment, the low pass filter outputs are taken from the output of the second I amplifier stage 407 on connection 435 and from the output of the second Q amplifier stage 456 on connection 475. This filter mode offers sharp filtering at the expense of increased complexity.

A third mode couples the first filter portion 410 to the second filter portion 450. An output of the first I amplifier stage 406 is coupled through a resistance 441 to an input of the first Q amplifier stage 452 through a switch 442. An output of the first Q amplifier stage 452 is coupled through a resistance 445 to the input of the first I amplifier stage 406 through a switch 444. This allows the first I amplifier stage 406 to also operate on the Q output of the first Q amplifier stage 452; and allows the first Q amplifier stage 452 to operate on the I output of the first I amplifier stage 406.

An output of the second I amplifier stage 407 is coupled through a resistance 446 to an input of the second Q amplifier stage 456 through a switch 447. An output of the second Q amplifier stage 456 is coupled through a resistance 449 to the input of the second I amplifier stage 407 through a switch 448. This allows the second I amplifier stage 407 to also operate on the Q output of the second Q amplifier stage 456; and allows the second Q amplifier stage 456 to operate on the I output of the second I amplifier stage 407. The switches 442, 444, 447 and 448 can be fabricated using any of a variety of transistor devices and technologies and can be controlled to be conductive or non-conductive using control logic (not shown).

When the switches 442, 444, 447 and 448 are conductive, (along with the switches 408, 409, 418, 419, 458, 459, 468 and 469 being conductive, and with the switches 436 and 486 being non-conductive), a complex bandpass filter can be constructed. The bandpass filter outputs are taken from the output of the first I amplifier stage 406 on connection 427 and from the output of the first Q amplifier stage 452 on connection 477. This filter offers filtering of positive or negative frequencies (depending on the I/Q arrangement) with modest image rejection.

Figure 5:
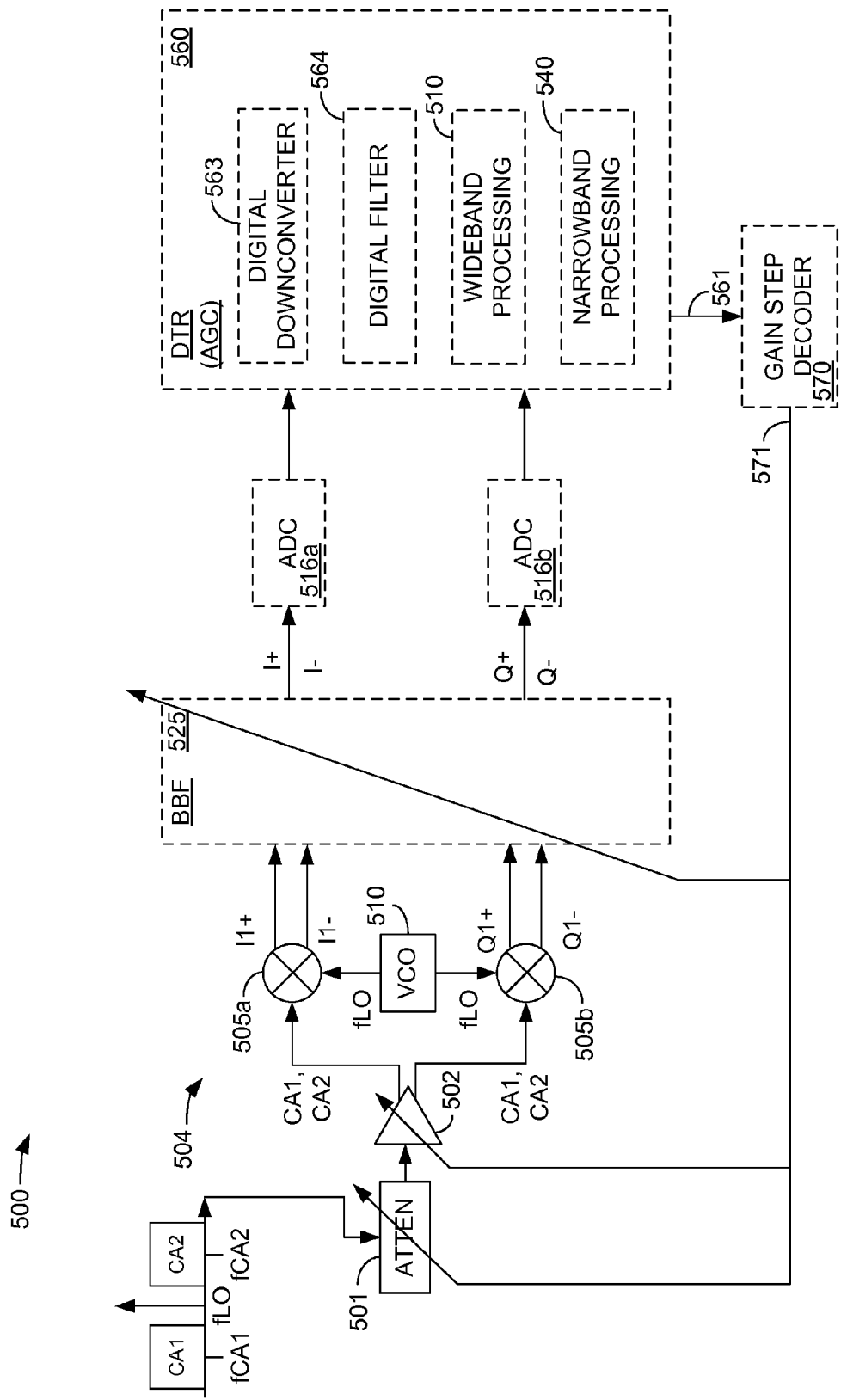
FIG. 5 is a schematic diagram illustrating an exemplary embodiment of a portion of a receiver of a spectrum sensing radio.

FIG. 5 is a schematic diagram illustrating an exemplary embodiment of a portion of a receiver of a spectrum sensing radio. In an exemplary embodiment, the receiver portion 500 comprises an adjustable attenuator 501 and an adjustable low noise amplifier (LNA) 502 configured to receive one or more channels. The adjustable attenuator 501 and an adjustable LNA 502 can be configured to provide a response based on a number of different gain modes. In an exemplary embodiment, the different gain modes can be selected based on an analysis of signal power level in the receive spectrum. In an exemplary embodiment, a gain of the adjustable attenuator 501 and the adjustable LNA 502 are adjusted based on the amount of signal power detected in the receive spectrum. The mixer 504 comprises an in-phase (I) mixer 505a and a quadrature (Q) mixer 505b. The mixer 504 receives a single local oscillator (LO) signal generated by a receive LO signal generator (referred to as a voltage controlled oscillator (VCO) 510. The VCO 510 includes a phase locked loop (PLL) (not shown for simplicity).

The receiver portion 500 also comprises an exemplary embodiment of an adjustable baseband filter 525. The adjustable baseband filter 525 is an exemplary embodiment of the baseband filter 425 of FIG. 4, and can be adjusted for a desired filter response, and can be configured as a number of different sub-filters to provide the filtering modes described above. In an exemplary embodiment, the baseband filter 425 can be configured to provide a response and bandwidth based on a number of different gain modes. In an exemplary embodiment, the different gain modes can be selected based on an analysis of signal power level in the receive spectrum. In an exemplary embodiment, a bandwidth of the baseband filter 425 is adjusted based on the amount of signal power detected in the receive spectrum. In an exemplary embodiment, the adjustable attenuator 501, the adjustable LNA 502, the mixer 504 and the adjustable baseband filter 525 can be referred to as a receiver front end.

The receiver portion 500 also comprises analog-to-digital-converters (ADC's) 516a and 516b for converting the analog input signals into digital signals to be further processed by a processing circuit referred to as a digital transceiver (DTR) 560. In an exemplary embodiment, the DTR 560, and a gain step decoder 570 can be part of, or can be operatively connected to, the data processor 310 of FIG. 3.

The DTR 560 performs an automatic gain control (AGC) processing function on the I+ and I− output of the ADC 516a and the Q+ and Q− output of the ADC 516b, including, but not limited to digital downconversion 563, digital filtering 564, and comprises a wideband signal processing circuit 510 and a narrowband signal processing circuit 540. The DTR 560 performs one or more iterations of communication spectrum analysis, and provides a digital gain control signal over connection 561 to the gain step decoder 570. The signal on connection 561 may comprise one or more of a wideband power estimation signal and a narrowband power estimation signal that can be determinative of the power levels of signals in the receive communication spectrum. In an exemplary embodiment, jammer signals in the receive communication spectrum can be determined based on their power level. In an exemplary embodiment, the gain step decoder 570 converts the signal on connection 561 to a gain control signal on connection 571 that is based on the jammer power level. The control signal on connection 571 can comprise one or more control parameters, and can be configured to control the gain of the adjustable attenuator 501, the gain of the adjustable LNA 502 and the gain of the adjustable baseband filter 525, so that a communication signal may be received without saturating the receiver circuits.

A communication device (user equipment (UE)) having the receiver portion 500 is capable of periodically tuning to and receiving an entire band at a time in order to determine spectral use and the channels available in the entire receive band spectrum. The receiver portion 500 can be tuned to have a variable gain and a variable bandwidth to tune to a specific channel or to receive multiple channels.

The adjustable attenuator 501, the adjustable LNA 502 and the adjustable baseband filter 525 are quickly reconfigurable to adapt to various gain conditions and signals present in the receive spectrum.

In an exemplary embodiment, the receiver portion 500 employs a fast feedback control mechanism to adjust parameters of the adjustable attenuator 501, the adjustable LNA 502 and the adjustable baseband filter 525, including, but not limited to, the gain of the adjustable attenuator 501, the gain of the adjustable LNA 502 and the gain of the adjustable baseband filter 525.

In an exemplary embodiment, the wireless communication device 300 (FIG. 3) is capable of transmitting the received power relating to each channel to other devices, such as, for example, other transceivers, base stations, or any other communication device.

In an exemplary embodiment, the wireless communication device 300 (FIG. 3) can determine the available spectrum and reconfigure its receiver based on the detected power, and transmit the received power to other communication devices during a communication session, including, for example, during a data communication session, during a telephone call, and any other communication session.

Figure 6:
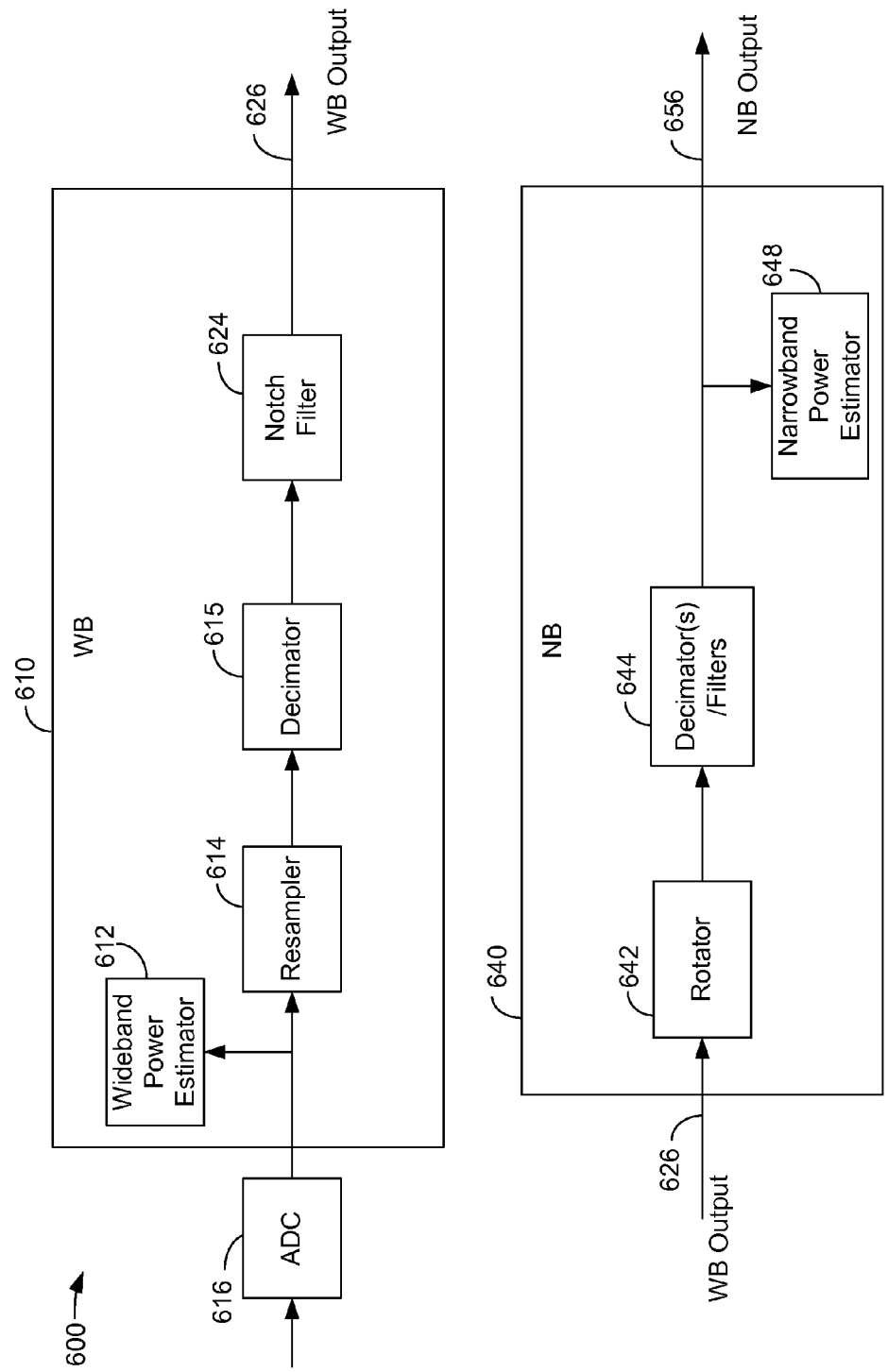
FIG. 6 is a block diagram illustrating wideband and narrowband circuit elements of the digital transceiver of FIG. 5.

FIG. 6 is a block diagram 600 illustrating wideband and narrowband circuit spectrum analysis components of the DTR 560 of FIG. 5. The components in the block diagram 600 comprise a portion of the components in the DTR 560 of FIG. 5, whereby the components in the block diagram 600 can be used to perform wideband and narrowband spectrum analysis on any of an entire communication receive band and portions of the receive band to identify the power in the entire communication receive band and in one or more communication channels within the communication receive band.

An ADC 616 provides a digital signal representing the I and Q portions of the received communication signal to a wideband signal processing circuit 610. The wideband signal processing circuit 610 comprises a wideband power estimator 612, a signal resampler 614, a decimator 615, and a notch filter 624. A signal representing the wideband communication spectrum, including jammer signal power, is provided over connection 626.

The wideband power estimator 612 determines a power level of the signal provided by the ADC 616 and includes jammer signal power. The resampler 614 adjusts the sampling rate of the signal provided by the ADC 616.

The decimator 615 reduces the sampling rate of the signal provided by the resampler 614.

The notch filter 624 filters the signal provided by the decimator 615.

The wideband communication spectrum signal on connection 626 is provided to a narrowband signal processing circuit 640. The narrowband signal processing circuit 640 comprises a rotator 642, a decimator/filter circuit 644, and a narrowband power estimator 648. A signal representing the narrowband communication spectrum is provided over connection 656.

The rotator 642 performs a final digital downconversion of the signal on connection 626.

The decimator/filter circuit 644 provides filtering to generate a narrowband signal output on connection 656.

The narrowband power estimator 648 determines a power level of the signal provided by the decimator/filter circuit 644 and includes jammer signal power.

The wideband output on connection 626 comprises a signal representing the power in the communication spectrum after wideband signal analysis. The narrowband output on connection 656 comprises a signal representing the power in the communication spectrum after narrowband signal analysis. The wideband output on connection 626 and the narrowband output on connection 656 are used by the DTR 560 (FIG. 5) to generate a control signal on connection 561 that is provided to the gain step decoder 570. The gain step decoder 570 generates the control signal on connection 571. The control signal on connection 571 can comprise one or more control parameters, and can be configured to control one or more adjustable parameters, such as the gain of the adjustable attenuator 501, the gain of the adjustable LNA 502 and the gain and bandwidth of the adjustable baseband filter 525 based on the detected power in the communication spectrum.

Figure 7:
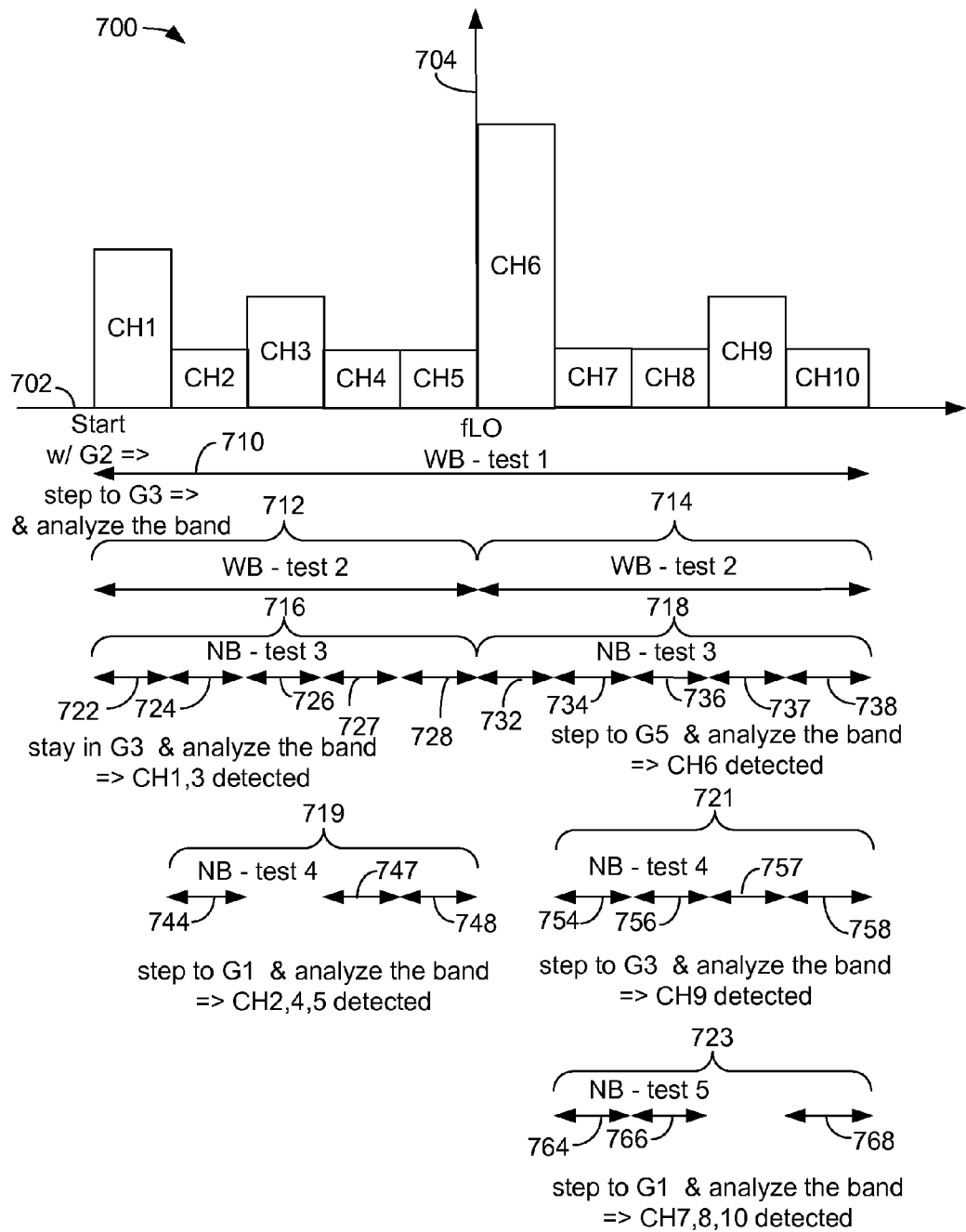
FIG. 7 is a graphical illustration of a communication spectrum processed by a spectrum sensing receiver.

FIG. 7 is a graphical illustration of a communication spectrum processed by a spectrum sensing receiver. The horizontal axis 702 refers to relative frequency and the vertical axis 704 refers to relative signal power. An exemplary local oscillator frequency, fLO, is shown at the approximate center of the axis 702.

A plurality of channels, CH1 through CH10, are arbitrarily shown along the horizontal axis 702. In an exemplary embodiment, the channels CH1 through CH10 may occupy a communication spectrum of approximately 100 MHz, in which each channel comprises a bandwidth of approximately 10 MHz. In an exemplary embodiment, some of the channels contain one or more signals having the same power level, and other channels contain one or more signals having different power levels. In an exemplary embodiment, the channels CH2, CH4, CH5, CH7, CH8 and CH10 are arbitrarily shown having signals with the same approximate relative power levels. The channels CH1, CH3, CH6 and CH9 are shown as having other arbitrary relative power levels.

In an exemplary embodiment, the DTR 560 (FIG. 5 and FIG. 6) can be used to analyze the communication spectrum to develop spectrum analysis results identifying the presence of the signals in the spectrum and showing any available unused spectrum.

In an exemplary embodiment, the wideband signal processing circuit 610 may perform a first wideband signal spectrum analysis illustrated in FIG. 7 using arrow 710. The first wideband signal spectrum analysis 710 may encompass the entire receive band including channels CH1 through CH10 at a first arbitrary gain level, G2. In an exemplary embodiment, there are six gain levels, G0, G1, G2, G3, G4 and G5, available in the receiver portion 500, with gain level G0 being the highest gain and the gain level G5 being the lowest gain. Further, the adjustable baseband filter 525 can be adjusted to have a response and a bandwidth that allows the entire communication spectrum to be analyzed.

In an exemplary embodiment, the DTR 560 may perform a second wideband signal spectrum analysis illustrated in FIG. 7 using arrow 712 and a third wideband signal spectrum analysis illustrated in FIG. 7 using arrow 714. The second wideband signal spectrum analysis 712 and the third wideband signal spectrum analysis 714 may each encompass a bandwidth that is less than the bandwidth of the entire receive band, where the second wideband signal spectrum analysis 712 may include the portion of the spectrum having channels CH1 through CH5 at an arbitrary gain level, G3, and where the third wideband signal spectrum analysis 714 may include the portion of the spectrum having channels CH6 through CH10 at an arbitrary gain level, G3. The adjustable baseband filter 525 is adjusted based on the portion of the communication spectrum sought to be analyzed. The gain is changed from the first arbitrary gain level of G2 to a second gain of G3 based on the results of the first wideband signal spectrum analysis 710. For example, because significant signal energy is present in channel CH1, the gain is reduced from G2 to G3 when performing the second wideband signal spectrum analysis 712. Similarly, because significant signal energy is present in channel CH6, the gain is reduced from G2 to G3 when performing the third wideband signal spectrum analysis 714.

Once the second wideband signal spectrum analysis 712 and the third wideband signal spectrum analysis 714 are complete, the results of the analysis may be provided to the narrowband signal processing circuit 640.

In an exemplary embodiment, the narrowband signal processing circuit 640 may receive the wideband analysis results from the wideband signal processing circuit 610 and may perform a first narrowband signal spectrum analysis 716 on the results of the second wideband signal spectrum analysis 712; and may perform a second narrowband signal spectrum analysis 718 on the results of the third wideband signal spectrum analysis 714. As stated above, the adjustable baseband filter 525 is adjusted based on the portion of the communication spectrum sought to be analyzed.

The first narrowband signal spectrum analysis 716 may comprise five illustrative narrowband signal spectrum analysis instances 722, 724, 726, 727, and 728 at an exemplary gain mode of G3. In this exemplary embodiment, the gain mode remains in gain mode G3 for the first narrowband signal spectrum analysis 716 because there is insufficient power in the channels CH1, CH2, CH3, CH4 and CH5 to warrant a gain change. In an exemplary embodiment, channels CH1 and CH3 may be detected.

The second narrowband signal spectrum analysis 718 may comprise five illustrative narrowband signal spectrum analysis instances 732, 734, 736, 737, and 738 at an exemplary gain mode of G5. In this exemplary embodiment, the gain mode is changed to gain mode G5 for the second narrowband signal spectrum analysis 718 because there is sufficient power in the channel CH6 to warrant a gain change so that the receiver portion 500 is not saturated with the power in channel CH6. In an exemplary embodiment, channel CH6 may be detected. Because there is significant power in channel CH6, the gain mode for the second narrowband signal spectrum analysis 718 has been lowered to gain mode G5 so that the receiver portion 500 is not saturated with the power in channel CH6.

In an exemplary embodiment, the narrowband signal processing circuit 640 may perform additional narrowband signal spectrum analysis 719 comprising instances 744, 747, and 748 on the portions of the spectrum where channels undetected by the first narrowband signal spectrum analysis 716 may exist. In this exemplary embodiment, the gain mode is changed to gain mode G1 for the additional narrowband signal spectrum analysis 719 because there is relatively low power in the channels CH2, CH4 and CH5, such that an increase in the gain mode may be used to determine the power on those channels. In this exemplary embodiment, the additional narrowband signal spectrum analysis instances 744, 747, and 748 are used to detect power in channels CH2, CH4 and CH5, at an exemplary gain mode of G1. The gain is increased to gain mode G1 for the additional narrowband signal spectrum analysis instances 744, 747, and 748 because there is relatively low signal power in channels CH2, CH4 and CH5.

In an exemplary embodiment, the narrowband signal processing circuit 640 may perform additional narrowband signal spectrum analysis 721 comprising instances 754, 756, 757, and 758 on the portions of the spectrum where channels undetected by the second narrowband signal spectrum analysis 718 may exist. In this exemplary embodiment, the gain mode is changed to gain mode G3 for the additional narrowband signal spectrum analysis 721 because there is relatively low power in the channels CH7, CH8, CH9 and CH10, such that an increase in the gain mode may be used to determine the power on those channels. In this exemplary embodiment, the additional narrowband signal spectrum analysis instances 754, 756, 757, and 758 are used to detect power in channels CH7, CH8, CH9 and CH10, at an exemplary gain mode of G3. In this exemplary embodiment, only power in channel CH9 is detected at the existing gain setting of G3.

In an exemplary embodiment, the narrowband signal processing circuit 640 may perform additional narrowband signal spectrum analysis 723 comprising instances 764, 766, and 768 on the portions of the spectrum where channels undetected by the additional narrowband signal spectrum analysis 721 may exist. In this exemplary embodiment, the gain mode is changed to gain mode G1 for the additional narrowband signal spectrum analysis 723 because there is relatively low power in the channels CH7, CH8 and CH10, such that an increase in the gain mode may be used to determine the power on those channels. In this exemplary embodiment, the additional narrowband signal spectrum analysis instances 764, 766, and 768 are used to detect power in channels CH7, CH8 and CH10, at an exemplary gain mode of G1.

With regard to the gain levels, the DTR 560, when operating as a spectrum analyzer, can direct the adjustable components in the receiver portion 500 to reconfigure to a gain mode that provides the most appropriate sensitivity without being saturated by a large signal by basing the gain mode on the power in the spectrum. Thus, when signals are large (for example, the signal in CH6), the receiver should be in a low gain mode as otherwise the receiver could be saturated when such a large signal undergoes large amplification. In an exemplary embodiment, the terms "high" and "low" signal power are relative and can refer to a signal power in the range of, for example, between approximately −100 dBm and approximately −30 dBm, with each receiver gain level (G0 through G5) covering approximately 10 dB of dynamic range.

In FIG. 7, for example, when the receiver is in gain mode G5, which is a relatively small amount of gain compared to gain modes G0, G1, G2, G3 or G4, the signal in CH6 can be extracted without saturating the receiver by using a relatively small amount of receive gain.

However, signals having lower relative power in other channels (CH7, CH8, CH9 and CH10, for example) cannot be extracted using the same G5 gain mode because their respective other signal-to-noise ratio would be poor. For example, that is the reason that the signal in CH7 is extracted in gain mode G1.

As the DTR 560 transitions between wideband signal detection and narrowband signal detection, and depending on the power level of signals in particular channels, the adjustable baseband filter 525 can be reconfigured to provide any of a real low pass filter characteristic, a bandpass filter characteristic, a high-pass filter characteristic, and a complex band-pass filter characteristic to avoid saturating the receiver with a signal having a high power level. Further, the frequency of the local oscillator signal, fLO, can be retuned depending on the frequency of the particular receive band and/or channel being analyzed.

Figure 8:
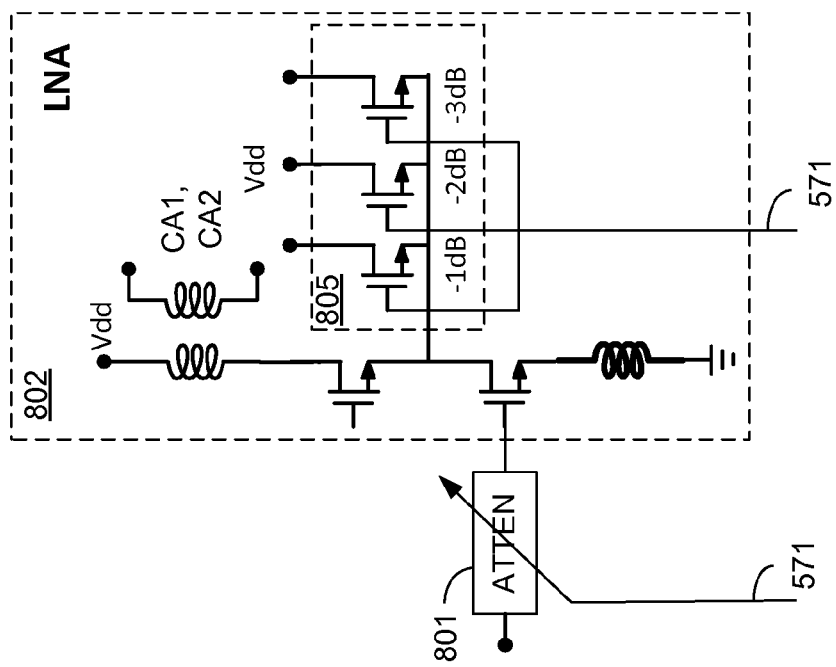
FIG. 8 is a schematic diagram showing an exemplary embodiment of an adjustable attenuator and an adjustable LNA.

FIG. 8 is a schematic diagram showing an exemplary embodiment of an adjustable attenuator and an adjustable LNA. The control signal on connection 571 can control the amount of attenuation provided by the adjustable attenuator 801. The control signal on connection 571 can also control the amount of amplification provided by the adjustable LNA 802 by selectively enabling and disabling the cascode devices 805 to provide the desired amount of amplification or attenuation.

Figure 9:
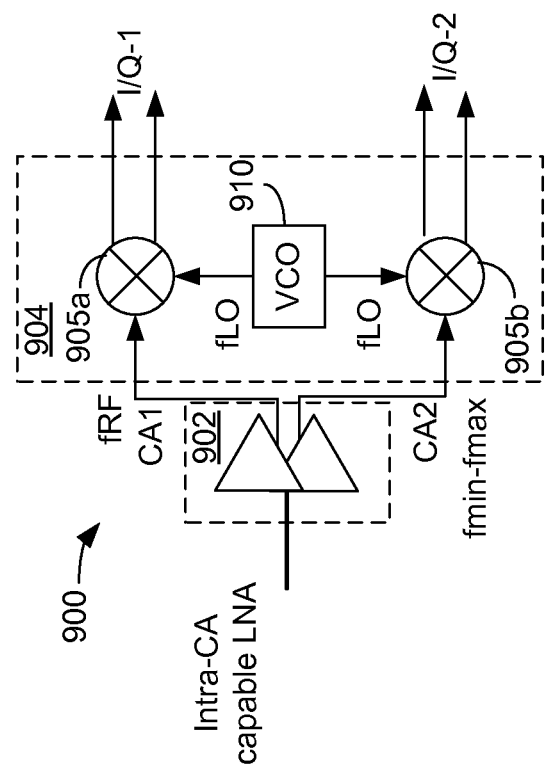
FIG. 9 is a schematic diagram showing an alternative embodiment of a receiver front end configured for intra-band CA operation.

FIG. 9 is a schematic diagram 900 showing an alternative embodiment of a receiver front end 900 configured for intra-band CA operation. The receiver front end comprises an LNA 702, and a mixer 904 configured to receive a local oscillator (fLO) signal from a VCO 910.

When the receiver front end 900 is not operating in a CA mode to receive a communication signal having two or more frequencies, an intra-band CA mode can be enabled to split the incoming signal without significant loss of noise figure (NF) and gain. The intra-band CA signal can be down-converted by the CA2 LO operating at the center of the band to capture the spectrum in the band. The intra-band CA receiver can be periodically turned on to capture the spectrum in the band without the penalty of power consumption. To improve this system further, the intra-band CA path can be modified to not split the signal equally but only bleed a small amount of signal to the intra-band CA path to minimize impact on main path.

Figure 10:
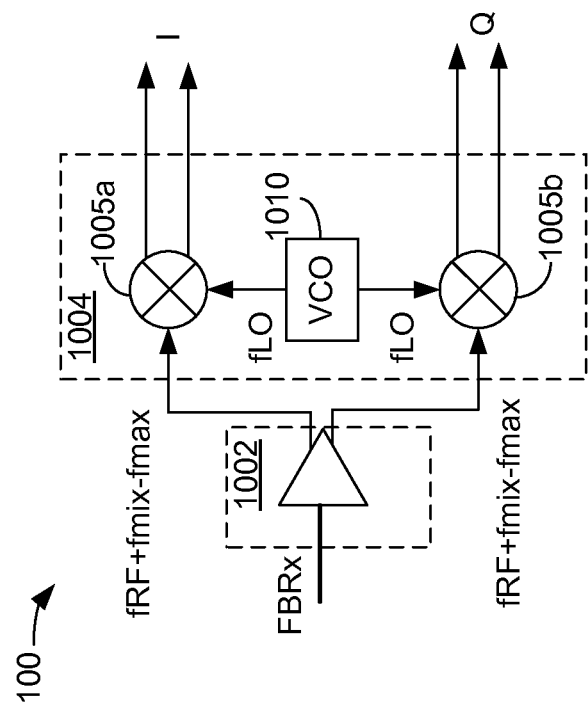
FIG. 10 is a schematic diagram showing an alternative embodiment of a receiver front end configured for intra-band CA operation.

FIG. 10 is a schematic diagram 1000 showing an alternative embodiment of a receiver front end configured for intra-band CA operation. The receiver front end comprises an LNA 1002, a mixer 1004 configured to receive a local oscillator (fLO) signal from a VCO 1010.

In an exemplary embodiment, the receiver front-end 1000 can be used to receive signals from 700 MHz-2.7 GHz when implemented as a Feedback-Receiver (i.e., having matchless wide-band input). Such a receiver can be used this to measure transmit power of a transmitter located with the receiver. However, this receiver can also be used to detect the entire spectrum (the down-converter is enabled when the phone is used; this mode is referred to as an "on-line calibration" mode). Thus, the on-line calibration mode can be used to measure the received signal across a wider band in addition to measuring the output of the power amplifier.

Figure 11:
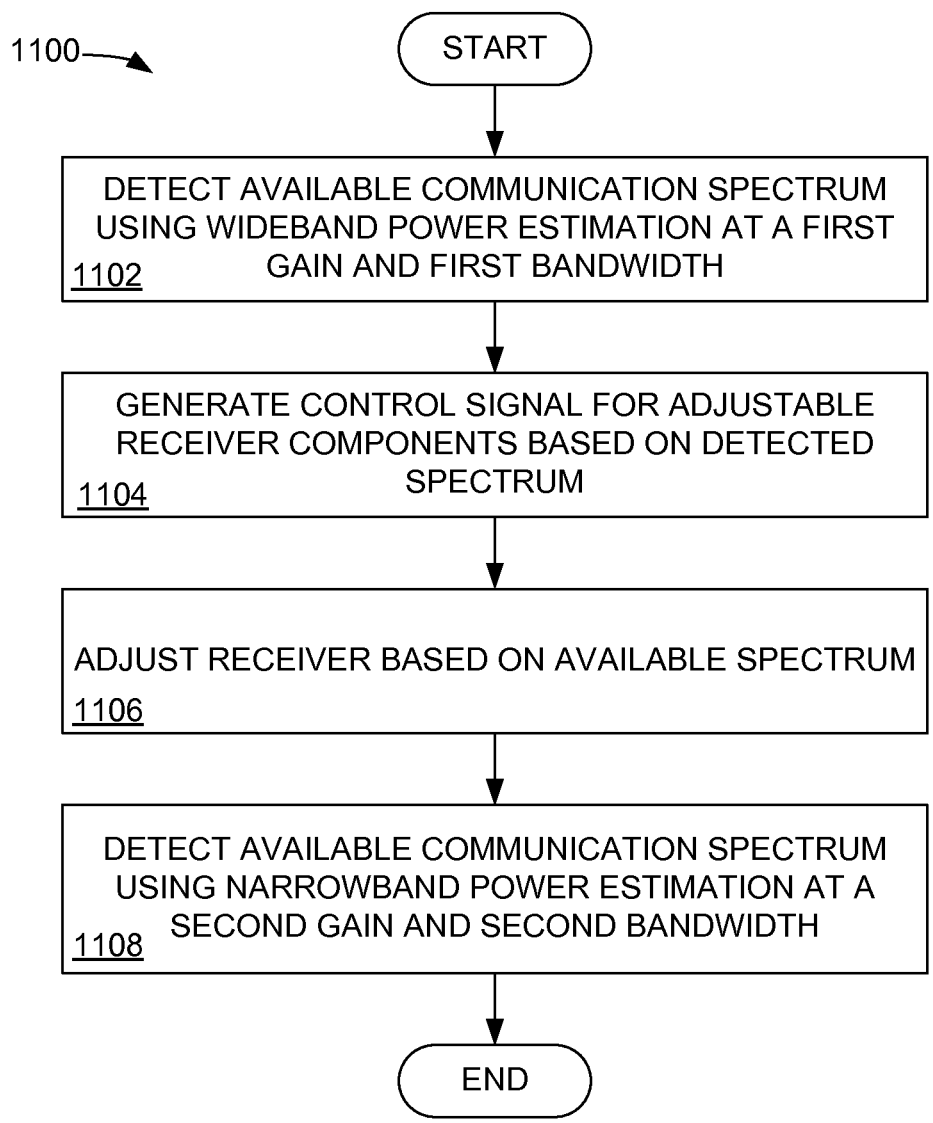
FIG. 11 is a flow chart describing the operation of an exemplary embodiment of a reconfigurable carrier-aggregation receiver and filter that can be used to process non-contiguous carriers.

FIG. 11 is a flow chart 1100 describing the operation of an exemplary embodiment of a spectrum sensing radio. In block 1102, the available communication spectrum is detected using wideband power estimation at a first receiver gain setting and a first bandwidth. In block 1104 the gain step decoder generates a control signal based on the wideband power estimation and the detected spectrum. In block 1106, the receiver gain and filter bandwidth is adjusted based on the control signal.

In block 1108, the available communication spectrum is detected using narrowband power estimation at the second gain setting and second bandwidth setting.

The spectrum sensing radio receiver described herein may be implemented on one or more ICs, analog ICs, RFICs, mixed-signal ICs, ASICs, printed circuit boards (PCBs), electronic devices, etc. The spectrum sensing radio receiver may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the spectrum sensing radio receiver described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

Although selected aspects have been illustrated and described in detail, it will be understood that various substitutions and alterations may be made therein without departing from the spirit and scope of the present invention, as defined by the following claims.

What is claimed is:

1. A device, comprising:
    a reconfigurable receiver front end having variable gain and variable bandwidth configured to tune to a plurality of communication channels in a communication band during a communication session, the reconfigurable receiver front end responsive to a signal power level; and
    a digital transceiver configured to analyze the communication band from a wideband analysis to a narrowband analysis to determine the signal power level in the plurality of communication channels, the device configured to transmit a signal representing the determined signal power level in any of the plurality of communication channels in the communication band to another device.

2. The device of claim 1, wherein the signal power level determines an adjustable parameter of the reconfigurable receiver front end for a communication band analysis.

3. The device of claim 2, wherein the reconfigurable receiver front end is configured to tune to a selected one of the plurality of communication channels.

4. The device of claim 1, wherein the reconfigurable receiver front end is responsive to a signal power level in the selected one of the plurality of communication channels.

5. The device of claim 1, wherein the reconfigurable receiver front end comprises an adjustable attenuator, an adjustable low noise amplifier, and an adjustable baseband filter.

6. The device of claim 5, wherein a gain of the adjustable attenuator and a gain of the low noise amplifier are adjusted based on the signal power level.

7. The device of claim 5, wherein a bandwidth of the adjustable baseband filter is adjusted based on the signal power level.

8. A method comprising:
    tuning a receiver front end having variable gain and variable bandwidth to a plurality of communication channels in a communication band during a communication session in response to a signal power level;
    digitally analyzing the communication band from a wideband analysis to a narrowband analysis to determine the signal power level in the plurality of communication channels;
    adjusting a gain of an adjustable attenuator and an adjustable low noise amplifier associated with the receiver front end; and
    transmitting a signal representing the determined signal power level to another device.

9. The method of claim 8, further comprising adjusting a gain of an adjustable attenuator and an adjustable low noise amplifier associated with the receiver front end.

10. The method of claim 8, further comprising adjusting a bandwidth of an adjustable baseband filter associated with the receiver front end.

11. A device, comprising:
    means for tuning a receiver front end having variable gain and variable bandwidth to a plurality of communication channels in a communication band during a communication session in response to a signal power level;
    means for digitally analyzing the communication band from a wideband analysis to a narrowband analysis to determine the signal power level in the plurality of communication channels; and
    means for transmitting a signal representing the determined signal power level to another device.

12. The device of claim 11, further comprising means for adjusting a gain of an adjustable attenuator and an adjustable low noise amplifier associated with the receiver front end.

13. The device of claim 11, further comprising means for adjusting a bandwidth of an adjustable baseband filter associated with the receiver front end.

* * * * *